(12) United States Patent
Walker

(10) Patent No.: US 10,663,508 B1
(45) Date of Patent: May 26, 2020

(54) VEHICLE LIGHT TESTER

(71) Applicant: William Walker, San Diego, CA (US)

(72) Inventor: William Walker, San Diego, CA (US)

( * ) Notice: Subject to any disclaimer, the term of this patent is extended or adjusted under 35 U.S.C. 154(b) by 258 days.

(21) Appl. No.: 15/889,495

(22) Filed: Feb. 6, 2018

(51) Int. Cl.
*G01R 31/00* (2006.01)
*G01R 31/44* (2020.01)
*G07C 5/08* (2006.01)

(52) U.S. Cl.
CPC .......... *G01R 31/006* (2013.01); *G01R 31/44* (2013.01); *G07C 5/08* (2013.01); *G07C 2205/02* (2013.01)

(58) Field of Classification Search
CPC ........ G01R 31/006; G01R 31/44; G07C 5/08; G07C 2205/02
See application file for complete search history.

(56) References Cited

U.S. PATENT DOCUMENTS

| | | | |
|---|---|---|---|
| 6,081,189 A | 6/2000 | Warner | |
| D485,196 S | 1/2004 | Zimmerman | |
| 7,124,003 B1 | 10/2006 | West | |
| 9,069,026 B1 | 6/2015 | Rutkowsky | |
| 2008/0042656 A1* | 2/2008 | Hall | G01R 31/006 |
| | | | 324/500 |
| 2009/0212784 A1* | 8/2009 | Kilian | G01R 31/44 |
| | | | 324/504 |
| 2012/0146653 A1* | 6/2012 | Rybolt | G01R 31/44 |
| | | | 324/504 |
| 2013/0063026 A1* | 3/2013 | Stickley | B60Q 1/2603 |
| | | | 315/77 |
| 2013/0162261 A1* | 6/2013 | Szoke | G01R 31/50 |
| | | | 324/503 |
| 2013/0229185 A1 | 9/2013 | Filio | |
| 2016/0167630 A1* | 6/2016 | Wolf | B60T 7/20 |
| 2017/0285084 A1* | 10/2017 | Johnson | G01R 31/007 |

FOREIGN PATENT DOCUMENTS

WO     2012040774     9/2010

* cited by examiner

*Primary Examiner* — Dominic E Hawkins
(74) *Attorney, Agent, or Firm* — Kyle A. Fletcher, Esq.

(57) ABSTRACT

The vehicle light tester is a testing instrument configured for use with a trailer. The trailer comprises a plurality of operating lights and a trailer port. The trailer port attaches the plurality of operating lights to a vehicle electric power system. The vehicle light tester attaches to the trailer port of the trailer. The vehicle light tester provides electrical power to the plurality of operating lights. The vehicle light tester further simulates the control signals that operate the plurality of lights. The vehicle light tester allows for testing of the operation of a plurality of operating lights without requiring the trailer port to be connected to the vehicle electric power system. The vehicle light tester further allows for the flashing of the plurality of operating lights in an emergency situation. The vehicle light tester comprises a housing and a testing circuit. The housing contains the testing circuit.

17 Claims, 6 Drawing Sheets

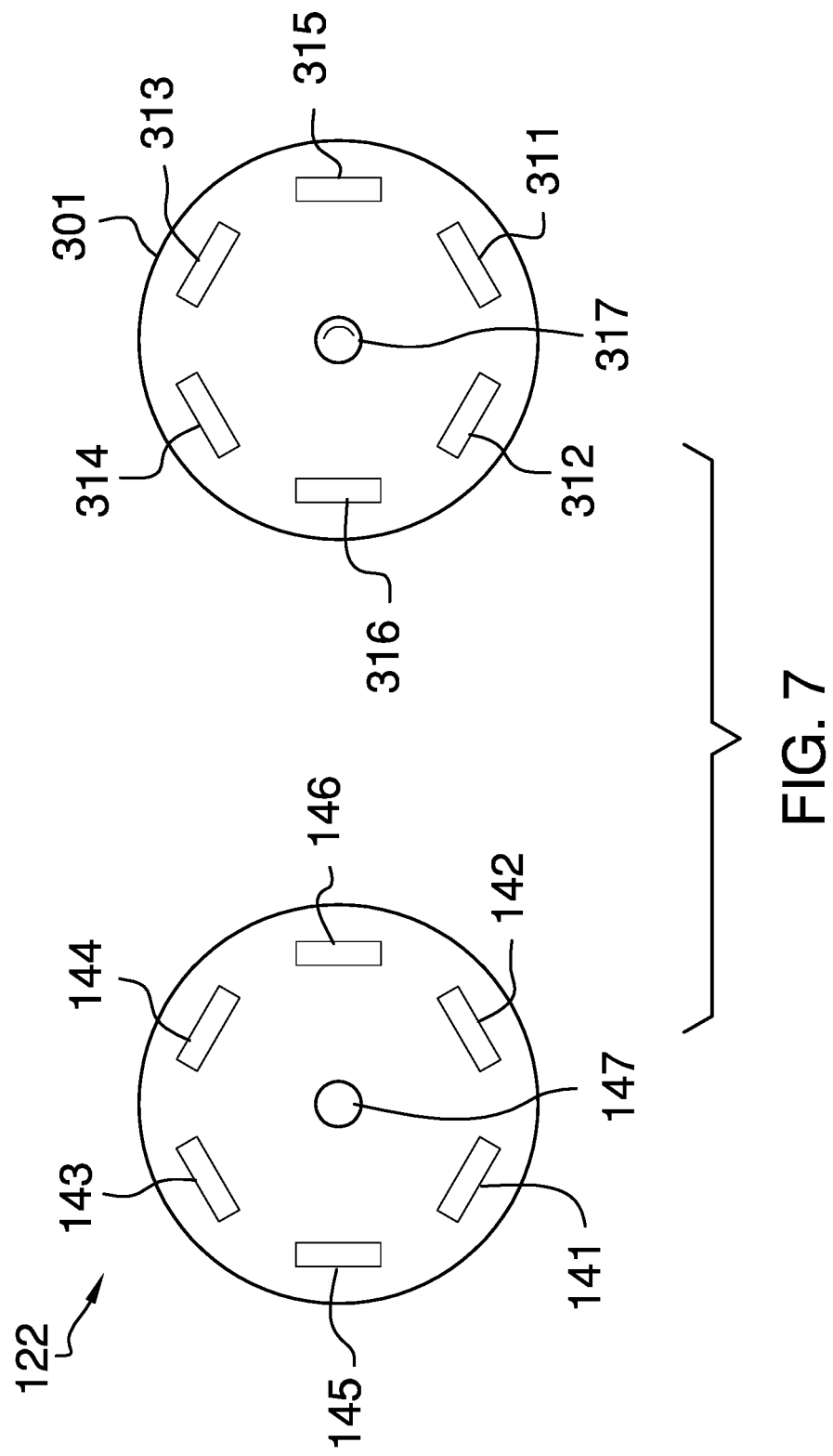

VEHICLE LIGHT TESTER

CROSS REFERENCES TO RELATED APPLICATIONS

Not Applicable

STATEMENT REGARDING FEDERALLY SPONSORED RESEARCH

Not Applicable

REFERENCE TO APPENDIX

Not Applicable

BACKGROUND OF THE INVENTION

Field of the Invention

The present invention relates to the field of instruments for measuring and testing, more specifically, an arrangement for testing the reliability and operation of an electrical circuit.

SUMMARY OF INVENTION

The vehicle light tester is a testing instrument. The vehicle light tester is configured for use with a trailer. Suitable trailers include, but are not limited to, the trailer of a tractor-trailer, a towed recreational vehicle commonly referred to as a "camper," and a towed recreational vehicle commonly referred to as a "fifth-wheel." The trailer further comprises a plurality of operating lights and a trailer port. The trailer port attaches the plurality of operating light to a vehicle electric power system. The vehicle electric power system is an external power source that provides electrical power and control signals to the plurality of operating lights. The vehicle light tester attaches to the trailer port of the trailer. The vehicle light tester provides electrical power to the plurality of operating lights. The vehicle light tester further simulates the control signals that operate the plurality of lights. The vehicle light tester allows for testing of the operation of a plurality of operating lights without requiring the trailer port to be connected to the vehicle electric power system. The vehicle light tester further allows for the flashing of the plurality of operating lights in an emergency situation. The vehicle light tester comprises a housing and a testing circuit. The housing contains the testing circuit.

These together with additional objects, features and advantages of the vehicle light tester will be readily apparent to those of ordinary skill in the art upon reading the following detailed description of the presently preferred, but nonetheless illustrative, embodiments when taken in conjunction with the accompanying drawings.

In this respect, before explaining the current embodiments of the vehicle light tester in detail, it is to be understood that the vehicle light tester is not limited in its applications to the details of construction and arrangements of the components set forth in the following description or illustration. Those skilled in the art will appreciate that the concept of this disclosure may be readily utilized as a basis for the design of other structures, methods, and systems for carrying out the several purposes of the vehicle light tester.

It is therefore important that the claims be regarded as including such equivalent construction insofar as they do not depart from the spirit and scope of the vehicle light tester. It is also to be understood that the phraseology and terminology employed herein are for purposes of description and should not be regarded as limiting.

BRIEF DESCRIPTION OF DRAWINGS

The accompanying drawings, which are included to provide a further understanding of the invention are incorporated in and constitute a part of this specification, illustrate an embodiment of the invention and together with the description serve to explain the principles of the invention. They are meant to be exemplary illustrations provided to enable persons skilled in the art to practice the disclosure and are not intended to limit the scope of the appended claims.

FIG. 7 is a detail view of an embodiment of the disclosure.

DETAILED DESCRIPTION OF THE EMBODIMENT

The following detailed description is merely exemplary in nature and is not intended to limit the described embodiments of the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to practice the disclosure and are not intended to limit the scope of the appended claims. Furthermore, there is no intention to be bound by any expressed or implied theory presented in the preceding technical field, background, brief summary or the following detailed description.

Figure 1:
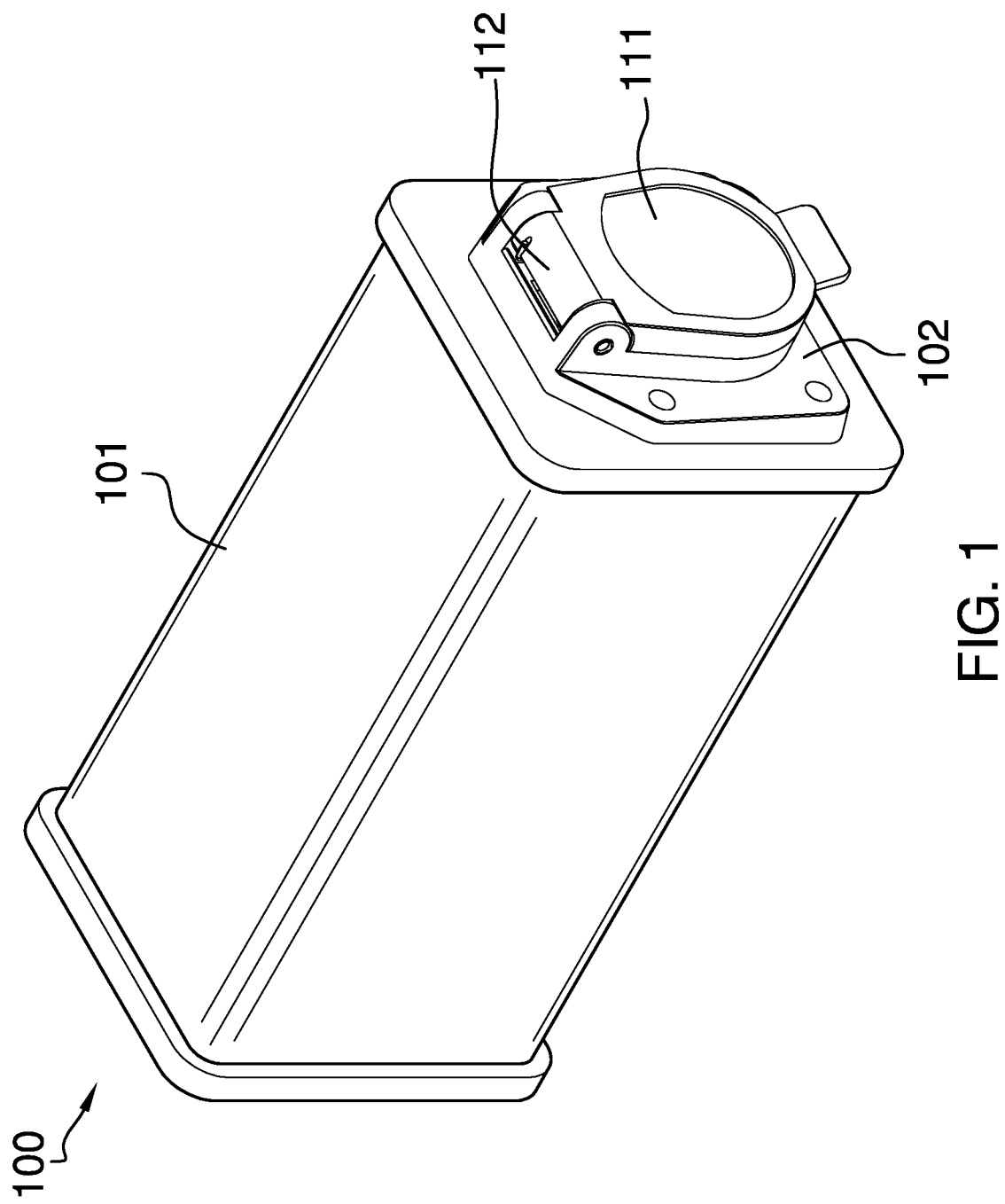
FIG. 1 is a perspective view of an embodiment of the disclosure.
Figure 2:
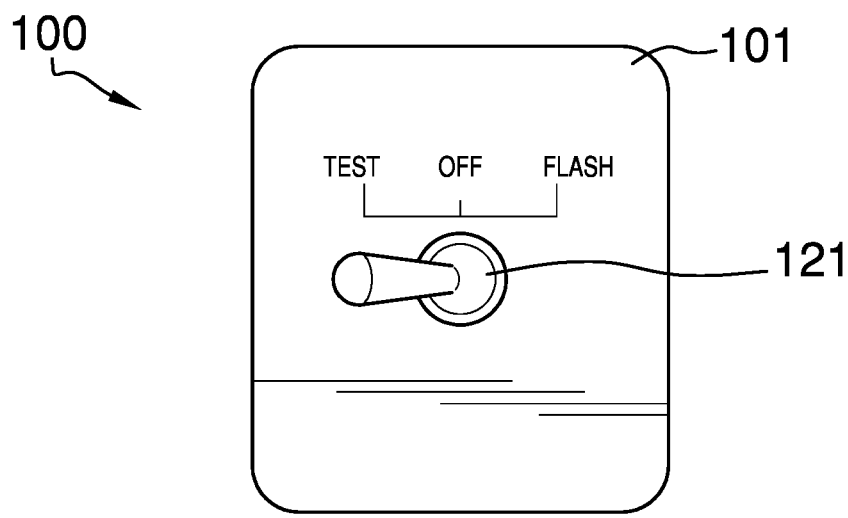
FIG. 2 is a rear view of an embodiment of the disclosure.
Figure 3:
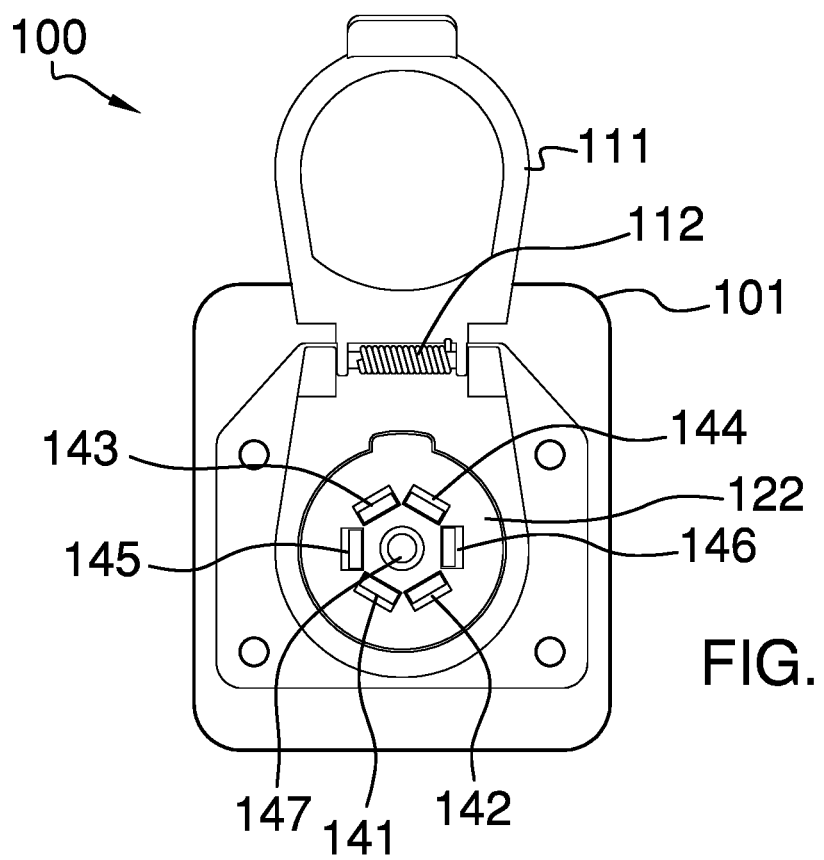
FIG. 3 is a front view of an embodiment of the disclosure.
Figure 4:
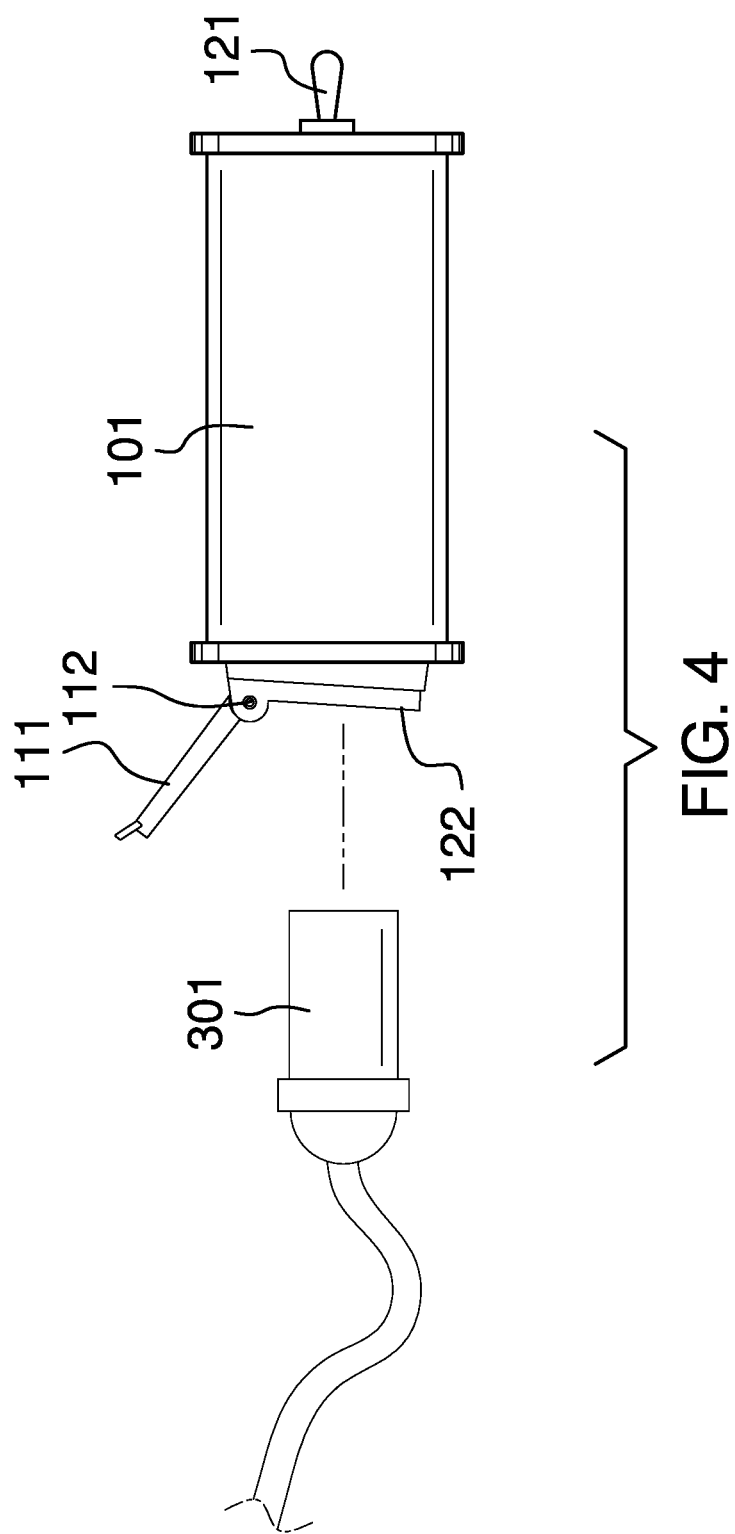
FIG. 4 is an in-use view of an embodiment of the disclosure.
Figure 5:
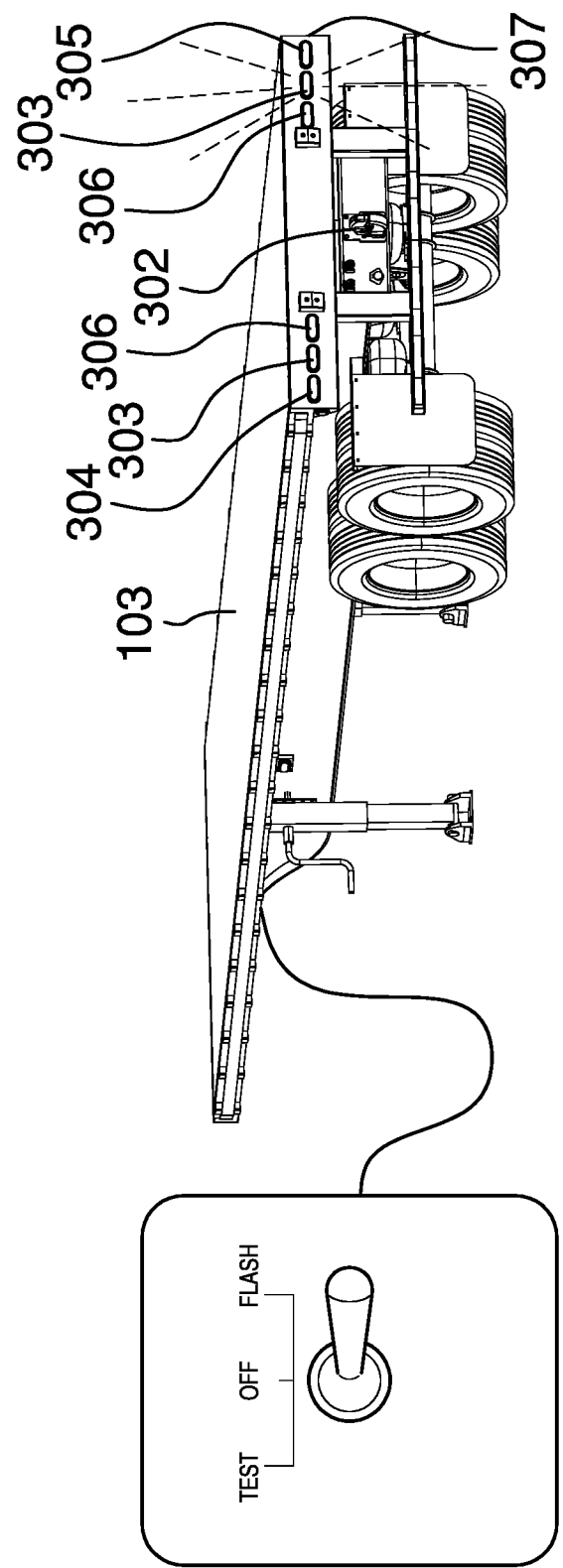
FIG. 5 is an in-use view of an embodiment of the disclosure.
Figure 6:
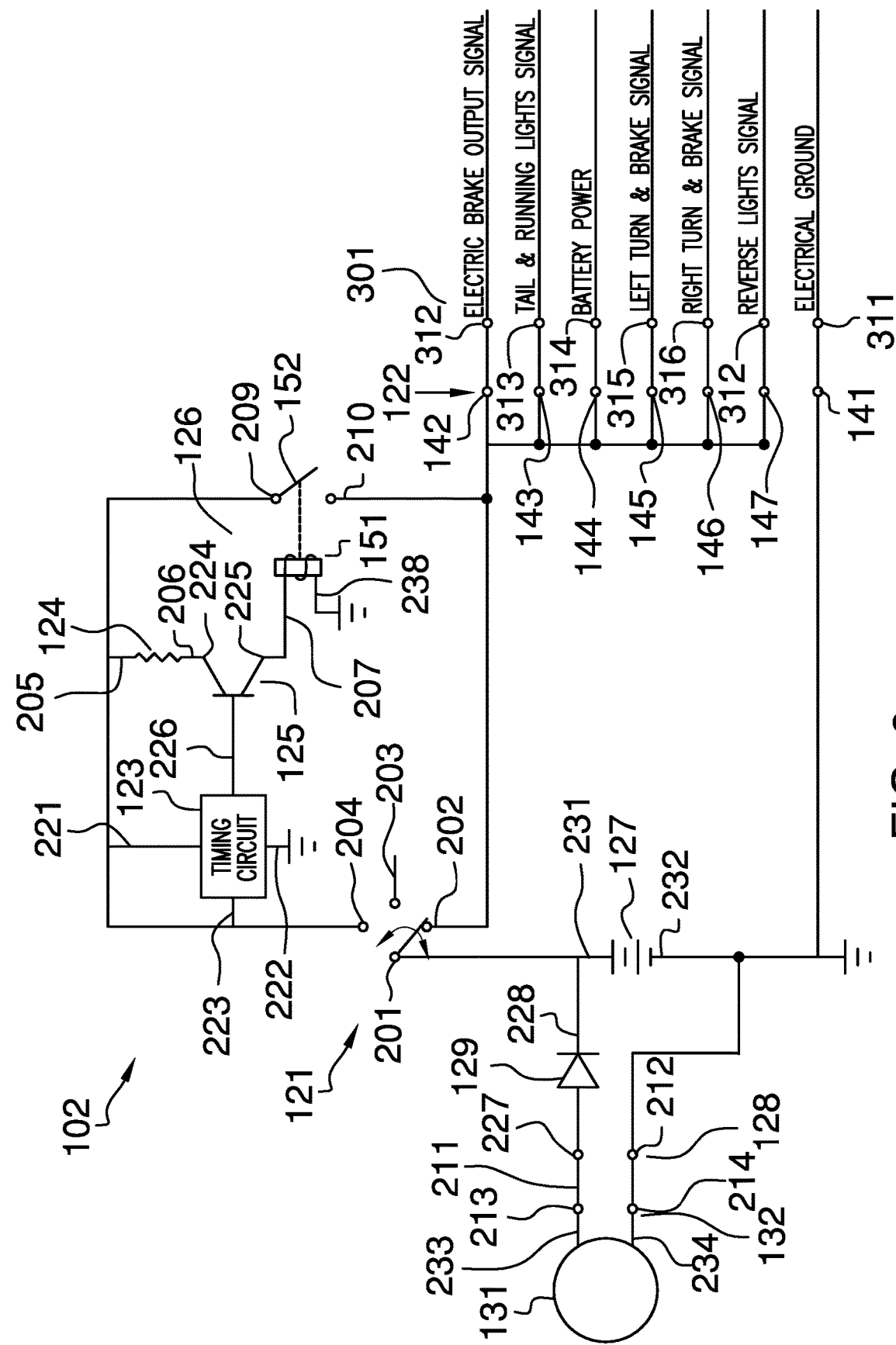
FIG. 6 is a schematic view of an embodiment of the disclosure.

Detailed reference will now be made to one or more potential embodiments of the disclosure, which are illustrated in FIGS. 1 through 7.

The vehicle light tester 100 (hereinafter invention) is a testing instrument. The invention 100 is configured for use with a trailer 103. Suitable trailers 103 include, but are not limited to, the trailer 103 of a tractor-trailer 103, a towed recreational vehicle commonly referred to as a "camper," and a towed recreational vehicle commonly referred to as a "fifth-wheel." The trailer 103 further comprises a plurality of operating lights 307 and a trailer 103 port 301. The trailer 103 port 301 attaches the plurality of operating lights 307 to a vehicle electric power system 131.

The vehicle electric power system 131 is an external power source that provides electrical power and control signals to the plurality of operating lights 307. The invention 100 attaches to the trailer 103 port 301 of the trailer 103. The invention 100 provides electrical power to the plurality of operating lights 307. The invention 100 further simulates the control signals that operate the plurality of lights. The invention 100 allows for testing of the operation of a plurality of operating lights 307 without requiring the trailer 103 port 301 to be connected to the vehicle electric power system 131. The invention 100 further allows for the flashing of the plurality of operating lights 307 in an emergency situation. The invention 100 comprises a housing 101 and a testing circuit 102. The housing 101 contains the testing circuit 102.

The specification and claims of this disclosure will hereinafter implicitly assume that the invention 100 is configured for use with the trailer 103 port 301 of a trailer 103. This is done for simplicity and for clarity of exposition of the disclosure and is not intended to limit the scope of the appended claims. Those skilled in the art will recognize that the innovations described in this disclosure can be readily modified to accommodate other towed vehicles such as towed recreational vehicles and fifth wheels. These modifications entail changing the form factor and pinouts of the trailer 103 port 301 to match the selected towed vehicle. Those skilled in the electrical arts will recognize that these changes can be readily made without undue experimentation.

The trailer 103 is a towed vehicle. The trailer 103 is a vehicle designated for testing with the invention 100. The trailer 103 comprises a trailer 103 port 301 and a plurality of operating lights 307.

The trailer 103 port 301 is a standardized port that electrically connects the plurality of operating lights 307 to the signal controls of the towing vehicle. The specification of the trailer 103 port 301 will vary by the type of vehicle being towed. The trailer 103 port 301 comprises an electrical ground socket 311, a brake signal socket 312, a tail and running light signal socket 313, a battery connection socket 314, a left turn and left brake signal socket 315, a right turn and right brake signal socket 316, and a reverse light signal socket 317.

The electrical ground socket 311 is an electrical connection to a defined voltage reference. The brake signal socket 312 is an electrical connection to the electrical circuit that controls the illumination of the brake light 302. The tail and running light signal socket 313 is an electrical connection to the electrical circuit that controls the illumination of the tail and running light 303. The battery connection socket 314 is an electrical connection to the electrical circuit that controls the flow of electrical power to the plurality of operating lights 307. The left turn and left brake signal socket 315 is an electrical connection to the electrical circuit that controls the illumination of the left turn and left brake light 304. The right turn and right brake signal socket 316 is an electrical connection to the electrical circuit that controls the illumination of the right turn and right brake light 305. The reverse light signal socket 317 is an electrical connection to the electrical circuit that controls the illumination of the reverse light 306.

The plurality of operating lights 307 comprises the operating lights that are required by law to be on the trailer 103. The plurality of operating lights 307 comprises a brake light 302, a tail and running light 303, a left turn and left brake light 304, a right turn and right brake light 305, and a reverse light 306. The brake light 302 is a lamp that, by law, is illuminated when the towing vehicle is braking. The tail and running light 303 is a lamp that, by law, is illuminated when the towing vehicle is operating in darkness. The left turn and left brake light 304 is a lamp that, by law, is illuminated when the towing vehicle is: 1) making a left turn; or 2) braking. The right turn and right brake light 305 is a lamp that, by law, is illuminated when the towing vehicle is: 1) making a right turn; or 2) braking. The reverse light 306 is a lamp that, by law, is illuminated when the towing vehicle is moving in the reverse direction.

The testing circuit 102 is an electrical circuit. The testing circuit 102: 1) applies electrical power to the plurality of operating lights 307 such that the operation of the plurality of operating lights 307 can be tested without connecting the trailer 103 to a vehicle electric power system 131; and, 2) operates a power circuit that flashes the plurality of operating lights 307 in an emergency situation. The testing circuit 102 comprises a switch 121, a connecting plug 122, a timing circuit 123, a pull-up resistor 124, a transistor 125, a relay 126, a battery 127, a charging plug 128, and a diode 129.

The switch 121 is further defined with a first lead 201, a second lead 202, a third lead 203, and a fourth lead 204. The pull-up resistor 124 is further defined with a fifth lead 205 and a sixth lead 206. The charging plug 128 is further defined with an eleventh lead 211 and a twelfth lead 212. The timing circuit 123 is further defined with a power lead 221, a ground lead 222, and a trigger lead 223. The transistor 125 is further defined with a collector 224, an emitter 225, and a base 226. The diode 129 is further defined with an anode 227, a cathode 228. The battery 127 is further defined with a first positive terminal 231 and a first negative terminal 232.

The testing circuit 102 is configured for use with a vehicle electric power system 131. The vehicle electric power system 131 further comprises a charging port 132. The charging port 132 is further defined with a thirteenth lead 213 and a fourteenth lead 214. The vehicle electric power system 131 is further defined with a second positive terminal 233 and a second negative terminal 234.

The switch 121 is a single pole triple throw switch. The switch 121 changes the mode of the invention 100 between a test mode, a flashing mode, and an inoperative mode.

The connecting plug 122 is an electrical connector that inserts into the trailer 103 port 301. The connecting plug 122 electrically connects the testing circuit 102 to the plurality of operating lights 307 such that the testing circuit 102 can operate the plurality of operating lights 307. The connecting plug 122 is a commercially available plug that is electrically and physically compatible with the trailer 103 port 301. The connecting plug 122 further comprises an electrical ground pin 141, a brake signal pin 142, a tail and running light signal pin 143, a battery connection pin 144, a left turn and left brake signal pin 145, a right turn and right brake signal pin 146, and a reverse light signal pin 147.

The electrical ground pin 141 is an electrical conductor that is inserted into the trailer 103 port 301 during normal use of the invention 100. The brake signal pin 142 is an electrical conductor that is inserted into the trailer 103 port 301 during normal use of the invention 100. The tail and running light signal pin 143 is an electrical conductor that is inserted into the trailer 103 port 301 during normal use of the invention 100. The battery connection pin 144 is an electrical conductor that is inserted into the trailer 103 port 301 during normal use of the invention 100. The left turn and left brake signal pin 145 is an electrical conductor that is inserted into the trailer 103 port 301 during normal use of the invention 100. The right turn and right brake signal pin 146 is an electrical conductor that is inserted into the trailer 103 port 301 during normal use of the invention 100. The reverse light signal pin 147 is an electrical conductor that is inserted into the trailer 103 port 301 during normal use of the invention 100.

The timing circuit 123 is an electrical circuit. The timing circuit 123 is triggered by the application of power to the trigger lead 223 of the timing circuit 123. The timing circuit 123 generates a regular output signal that times the flashing of the plurality of operating lights 307 in an emergency situation. The power lead 221 is the lead of the timing circuit 123 that draws electrical energy from the battery 127. The ground lead 222 is the lead of the timing circuit 123 that completes the power circuit between the timing circuit 123 and the battery 127. The trigger lead 223 is an input of the timing circuit 123. The trigger lead 223 initiates the cycling of the output signal of the timing circuit 123 when the invention 100 is in a flashing mode.

The transistor 125 operates as a switch. When a voltage is applied to the base 226, current will flow into the base 226 and the transistor 125 will act like a closed switch allowing current to flow from the collector 224 to the emitter 225. When the voltage is removed from the base 226, the transistor 125 will act like an open switch disrupting current flow from the collector 224 to the emitter 225.

The relay 126 is an electrically operated switch. The relay 126 controls the flow of electricity into the connecting plug 122 when the invention 100 is in a flashing mode. The relay 126 further comprises a relay coil 151 and a relay switch 152. The relay coil 151 is further defined with a seventh lead 207 and an eighth lead 208. The relay switch 152 is further defined with a ninth lead 209 and a tenth lead 210.

The relay coil 151 is energized by the transistor 125. When the relay coil 151 is energized the relay coil 151 closes the relay switch 152 thereby allowing current to flow from the battery 127 into the connecting plug 122. When the relay coil 151 is de-energized the relay coil 151 opens the relay switch 152 thereby discontinuing current flow from the battery 127 into the connecting plug 122. The relay switch 152 is a normally open switch. The relay switch 152 controls the flow of electricity from the battery 127 to the connecting plug 122 in the flashing mode.

The transistor 125 energizes the relay coil 151 when the output signal of the timing circuit 123 is active. The transistor 125 de-energizes the relay coil 151 when the output signal of the timing circuit 123 is inactive. The pull-up resistor 124 is a resistor that limits the flow of electricity from the battery 127 into the transistor 125. The transistor 125 operates as a switch. When the output signal is applied to the base 226, current will flow into the base 226 and the transistor 125 will act like a closed switch allowing current to flow from the collector 224 to the emitter 225. When the output signal is removed from the base 226, the transistor 125 will act like an open switch disrupting current flow from the collector 224 to the emitter 225.

The battery 127 is a commercially available rechargeable battery 127. The chemical energy stored within the rechargeable battery 127 is renewed and restored through the use of the charging plug 128. The charging plug 128 is an electrical circuit that reverses the polarity of the rechargeable battery 127 and provides the energy necessary to reverse the chemical processes that the rechargeable battery 127 initially used to generate the electrical energy. This reversal of the chemical process creates a chemical potential energy that will later be used by the rechargeable battery 127 to generate electricity. The charging plug 128 attaches to a vehicle electric power system 131 using a charging port 132. The charging plug 128 receives electrical energy from the vehicle electric power system 131 through the charging port 132.

The diode 129 is an electrical device that allows current to flow in only one direction. The diode 129 is installed between the rechargeable battery 127 and the charging plug 128 such that electricity will not flow from the first positive terminal 231 of the rechargeable battery 127 into the second positive terminal 233 of the vehicle electric power system 131. In the first potential embodiment of the disclosure, the charging plug 128 is a cigarette lighter adapter.

The housing 101 is a hollow rectangular block structure. The housing 101 is a casing. The housing 101 contains the testing circuit 102. The housing 101 is formed with all apertures and form factors necessary to allow the housing 101 to accommodate the use and operation of the testing circuit 102. The housing 101 further comprises a protecting cap 111 and a hinge 112.

The protecting cap 111 is a lid that is used to enclose the connecting plug 122 of the testing circuit 102. The protecting cap 111 protects the exposed pins of the testing circuit 102 that are used to connect the testing circuit 102 to the trailer 103 port 301. The hinge 112 is a commercially available product. The hinge 112 attaches the protecting cap 111 to the body of the housing 101 such that the protecting cap 111 rotates over and away from the connecting plug 122.

The following nine paragraphs describe the assembly of the invention 100.

The second positive terminal 233 of the vehicle electric power system 131 electrically connects to the thirteenth lead 213 of the charging port 132. The thirteenth lead 213 of the charging port 132 electrically connects to the eleventh lead 211 of the charging plug 128 when the charging plug 128 inserts into the charging port 132. The second negative terminal 234 of the vehicle electric power system 131 electrically connects to the fourteenth lead 214 of the charging port 132. The fourteenth lead 214 of the charging port 132 electrically connects to the twelfth lead 212 of the charging plug 128 when the charging plug 128 inserts into the charging port 132.

The eleventh lead 211 of the charging plug 128 electrically connects to the anode 227 of the diode 129. The cathode 228 of the diode 129 electrically connects to the first positive terminal 231 of the battery 127. The first positive terminal 231 of the battery 127 electrically connects to the first lead 201 of the switch 121.

The second lead 202 of the switch 121 electrically connects to the brake signal pin 142 of the connecting plug 122. The second lead 202 of the switch 121 electrically connects to the tail and running light signal pin 143 of the connecting plug 122. The second lead 202 of the switch 121 electrically connects to the battery connection pin 144 of the connecting plug 122. The second lead 202 of the switch 121 electrically connects to the left turn and left brake signal pin 145 of the connecting plug 122. The second lead 202 of the switch 121 electrically connects to the right turn and right brake signal pin 146 of the connecting plug 122. The second lead 202 of the switch 121 electrically connects to the reverse light signal pin 147 of the connecting plug 122.

The third lead 203 of the switch 121 is electrically isolated.

The fourth lead 204 of the switch 121 electrically connects to the power lead 221 of the timing circuit 123. The fourth lead 204 of the switch 121 electrically connects to the trigger lead 223 of the timing circuit 123. The fourth lead 204 of the switch 121 electrically connects to the fifth lead 205 of the pull-up resistor 124. The fourth lead 204 of the switch 121 electrically connects to the ninth lead 209 of the relay switch 152 of the relay 126.

The output signal of the timing circuit 123 electrically connects to the base 226 of the transistor 125. The sixth lead 206 of the pull-up resistor 124 electrically connects to the collector 224 of the transistor 125. The emitter 225 of the transistor 125 electrically connects to the seventh lead 207 of the relay coil 151 of the relay 126.

The tenth lead 210 of the relay switch 152 electrically connects to the brake signal pin 142 of the connecting plug 122. The tenth lead 210 of the relay switch 152 electrically connects to the tail and running light signal pin 143 of the connecting plug 122. The tenth lead 210 of the relay switch 152 electrically connects to the battery connection pin 144 of the connecting plug 122. The tenth lead 210 of the relay switch 152 electrically connects to the left turn and left brake signal pin 145 of the connecting plug 122. The tenth lead 210 of the relay switch 152 electrically connects to the right turn and right brake signal pin 146 of the connecting plug 122. The tenth lead 210 of the relay switch 152 electrically connects to the reverse light signal pin 147 of the connecting plug 122.

The connecting plug 122 inserts into the trailer 103 port 301 to form the following connections: 1) the electrical ground pin 141 of the connecting plug 122 electrically connects to the electrical ground socket 311 of the trailer 103 port 301; 2) the brake signal pin 142 of the connecting plug 122 electrically connects to the brake signal socket 312 of the trailer 103 port 301; 3) the tail and running light signal pin 143 of the connecting plug 122 electrically connects to the tail and running light signal socket 313 of the trailer 103 port 301; 4) the battery connection pin 144 of the connecting plug 122 electrically connects to the battery connection socket 314 of the trailer 103 port 301; 5) the left turn and left brake signal pin 145 of the connecting plug 122 electrically connects to the left turn and left brake signal socket 315 of the trailer 103 port 301; 6) the right turn and right brake signal pin 146 of the connecting plug 122 electrically connects to the right turn and right brake signal socket 316 of the trailer 103 port 301; and, 7) the reverse light signal pin 147 of the connecting plug 122 electrically connects to the reverse light signal socket 317 of the trailer 103 port 301.

The ground lead 222 of the timing circuit 123 electrically connects to the first negative terminal 232 of the battery 127. The twelfth lead 212 of the charging plug 128 electrically connects to the first negative terminal 232 of the battery 127. The electrical ground pin 141 of the connecting plug 122 electrically connects to the first negative terminal 232 of the battery 127. The eighth lead 208 of the relay coil 151 electrically connects to the first negative terminal 232 of the battery 127.

The following three paragraphs describe the operation of the invention 100.

When the switch 121 is positioned such that the first lead 201 of the switch 121 electrically connects to the second lead 202 of the switch 121, the first positive terminal 231 of the battery 127 is electrically connected to the brake signal pin 142, the tail and running light signal pin 143, the battery connection pin 144, the left turn and left brake signal pin 145, the right turn and right brake signal pin 146, and the reverse light signal pin 147.

When the switch 121 is positioned such that the first lead 201 of the switch 121 electrically connects to the third lead 203 of the switch 121, the testing circuit 102 is in an inoperative state.

When the switch 121 is positioned such that the first lead 201 of the switch 121 electrically connects to the fourth lead 204 of the switch 121, the first positive terminal 231 of the battery 127 electrically powers the timing circuit 123, the pull-up resistor 124, and the relay 126. When the switch 121 is positioned such that the first lead 201 of the switch 121 electrically connects to the fourth lead 204 of the switch 121, the first positive terminal 231 of the battery 127 further applies a voltage to the trigger lead 223 of the timing circuit 123 to initiate the flashing of the plurality of operating lights 307.

The following definitions were used in this disclosure:

Anodes and Cathodes: As used in this disclosure, an anode and a cathode are the connecting terminals of an electrical circuit element or device. Technically, the cathode is the terminal through which the physical electrons flow into the device. The anode is the terminal through which the physical electrons flow out of the device. As a practical matter the anode refers to: 1) the positive terminal of a power consuming electrical circuit element; 2) the negative terminal of a discharging battery or an electrical power source; and, 3) the positive terminal of a charging battery. As a further practical matter the cathode refers to: 1) the negative terminal of a power consuming electrical circuit element; 2) the positive terminal of a discharging battery or an electrical power source; and, 3) the negative terminal of a charging battery.

Battery: As used in this disclosure, a battery is a chemical device consisting of one or more cells, in which chemical energy is converted into electricity and used as a source of power.

Diode: As used in this disclosure, a diode is a two terminal semiconductor device that allows current flow in only one direction. The two terminals are called the anode and the cathode. Electric current is allowed to pass from the anode to the cathode.

Electrical Ground: As used in this disclosure, an electrical ground is a common reference voltage that is used in the design and implementation of electrical circuits. An electrical ground is often, but not necessarily, the discharge point of electric currents flowing through an electric circuit.

External Power Source: As used in this disclosure, an external power source is a source of the energy that is externally provided to enable the operation of the present disclosure. Examples of external power sources include, but are not limited to, electrical power sources and compressed air sources.

Form Factor: As used in this disclosure, the term form factor refers to the size and shape of an object.

Housing: As used in this disclosure, a housing is a rigid casing that encloses and protects one or more devices.

Lead: As used in this disclosure, a lead is a conductor that is physically used to electrically connect an electrical component into a larger circuit assembly.

Maintained Switch: A used in this disclosure, a maintained switch is a switch that maintains the position that was set in the most recent switch actuation. A maintained switch works in an opposite manner to a momentary switch.

Plug: As used in this disclosure, a plug is an electrical termination that electrically connects a first electrical circuit to a second electrical circuit or a source of electricity.

Port: As used in this disclosure, a port is an electrical termination that is used to connect a first electrical circuit to a second external electrical circuit. In this disclosure, the port is designed to receive a plug.

Pull-Up Resistor: As used in this disclosure, a pull-up resistor is an electrical resistor that is used to: 1) limit the current flow through a switching device; and, 2) to control the voltage level presented across a load resistor or a pull-down resistor.

Relay: As used in this disclosure, a relay is an automatic electromagnetic or electromechanical device that reacts to changes in voltage or current by opening or closing a switch in an electric circuit. Relays are further defined with a coil and a switch. Applying a voltage to the coil, usually referred to as energizing the coil, will cause the coil to change the position of the switch.

Resistor: As used in this disclosure, a resistor is a well-known and commonly available electrical device that inhibits the flow of electricity through an electric circuit. Within an electric circuit processing alternating currents, the resistor will not affect the phase of the alternating current. A current flowing through a resistor will create a voltage across the terminals of the resistor.

Switch: As used in this disclosure, a switch is an electrical device that starts and stops the flow of electricity through an electric circuit by completing or interrupting an electric circuit. The act of completing or breaking the electrical circuit is called actuation. Completing or interrupting an electric circuit with a switch is often referred to as closing or opening a switch respectively. Completing or interrupting an electric circuit is also often referred to as making or breaking the circuit respectively.

Timing Circuit: As used in this disclosure, a timing circuit refers to an electrical network of interconnected electrical elements, potentially including but not limited to, resistors, capacitors, diodes, transistors, and integrated circuit devices. The purpose of the timing circuit is to generate an electrical control signal after a predetermined amount of time. In common usage, a timing circuit is also referred to as timing circuitry. The "555" timing circuit is a well-known, documented, and commercially available timing circuit.

Tractor: As used in this disclosure, a tractor is a vehicle having a cab, no body and a powerful diesel or gasoline powered engine that is used to pull one or more trailers.

Trailer: As used in this disclosure, a trailer is an unpowered wheeled vehicle that is towed by a powered vehicle such as a tractor.

Transistor: As used in this disclosure, a transistor is a general term for a three-terminal semiconducting electrical device that is used for electrical signal amplification and electrical switching applications. There are several designs of transistors. A common example of a transistor is an NPN transistor that further comprises a collector terminal, an emitter terminal, and a base terminal and which consists of a combination of two rectifying junctions (a diode is an example of a rectifying junction). Current flowing from the collector terminal through the emitter terminal crosses the two rectifier junctions. The amount of the electric current crossing the two rectified junctions is controlled by the amount of electric current that flows through the base terminal.

Vehicle: As used in this disclosure, a vehicle is a motorized device that is used for transporting passengers, goods, or equipment. The term motorized vehicle refers to a vehicle can move under power provided by an electric motor or an internal combustion engine.

With respect to the above description, it is to be realized that the optimum dimensional relationship for the various components of the invention described above and in FIGS. 1 through 7 include variations in size, materials, shape, form, function, and manner of operation, assembly and use, are deemed readily apparent and obvious to one skilled in the art, and all equivalent relationships to those illustrated in the drawings and described in the specification are intended to be encompassed by the invention.

It shall be noted that those skilled in the art will readily recognize numerous adaptations and modifications which can be made to the various embodiments of the present invention which will result in an improved invention, yet all of which will fall within the spirit and scope of the present invention as defined in the following claims. Accordingly, the invention is to be limited only by the scope of the following claims and their equivalents.

The inventor claims:

1. A testing device comprising:
   wherein the testing device comprises a housing and a testing circuit;
   wherein the housing contains the testing circuit;
   wherein the testing device is a testing instrument;
   wherein the testing device is configured for use with a trailer;
   wherein the trailer further comprises a plurality of operating lights and a trailer port;
   wherein the trailer port attaches the plurality of operating lights to a vehicle electric power system;
   wherein the vehicle electric power system is an external power source that provides electrical power and control signals to the plurality of operating lights;
   wherein the testing device attaches to the trailer port of the trailer;
   wherein the testing device provides electrical power to illuminate and control the plurality of operating lights;
   wherein the testing device further allows for the flashing of the plurality of operating lights;
   wherein the testing circuit is an electrical circuit;
   wherein the testing circuit applies electrical power to the plurality of operating lights such that the operation of the plurality of operating lights is tested without connecting the trailer to a vehicle electric power system;
   wherein the testing circuit is a power circuit that flashes the plurality of operating lights;
   wherein the trailer port comprises an electrical ground socket, a brake signal socket, a tail and running light signal socket, a battery connection socket, a left turn and left brake signal socket, a right turn and right brake signal socket, and a reverse light signal socket;
   wherein the electrical ground socket is an electrical connection to a defined voltage reference;
   wherein the brake signal socket is an electrical connection to the electrical circuit that controls the illumination of the brake light;
   wherein the tail and running light signal socket is an electrical connection to the electrical circuit that controls the illumination of the tail and running light;
   wherein the battery connection socket is an electrical connection to the electrical circuit that controls the flow of electrical power to the plurality of operating lights;
   wherein the left turn and left brake signal socket is an electrical connection to the electrical circuit that controls the illumination of the left turn and left brake light;
   wherein the right turn and right brake signal socket is an electrical connection to the electrical circuit that controls the illumination of the right turn and right brake light;
   wherein the reverse light signal socket is an electrical connection to the electrical circuit that controls the illumination of the reverse light;
   wherein the plurality of operating lights comprises a brake light, a tail and running light, a left turn and left brake light, a right turn and right brake light, and a reverse light;
   wherein the brake light is a lamp;
   wherein the tail and running light is a lamp;
   wherein the left turn and left brake light is a lamp;
   wherein the right turn and right brake light is a lamp;
   wherein the reverse light is a lamp;

wherein the testing circuit comprises a switch, a connecting plug, a timing circuit, a pull-up resistor, a transistor, a relay, a battery, a charging plug, and a diode;
wherein the switch is further defined with a first lead, a second lead, a third lead, and a fourth lead;
wherein the pull-up resistor is further defined with a fifth lead and a sixth lead;
wherein the charging plug is further defined with an eleventh lead and a twelfth lead;
wherein the timing circuit is further defined with a power lead, a ground lead, and a trigger lead;
wherein the transistor is further defined with a collector, an emitter, and a base;
wherein the diode is further defined with an anode, a cathode;
wherein the battery is further defined with a first positive terminal and a first negative terminal.

2. The testing device according to claim 1
wherein the testing circuit is configured for use with the vehicle electric power system;
wherein the vehicle electric power system further comprises a charging port;
wherein the charging port is further defined with a thirteenth lead and a fourteenth lead;
wherein the vehicle electric power system is further defined with a second positive terminal and a second negative terminal.

3. The testing device according to claim 2
wherein the switch is a single pole triple throw switch;
wherein the switch changes the mode of the testing device between a test mode, a flashing mode, and an inoperative mode.

4. The testing device according to claim 3
wherein the connecting plug is an electrical connector that inserts into the trailer port;
wherein the connecting plug electrically connects the testing circuit to the plurality of operating lights such that the testing circuit can operate the plurality of operating lights;
wherein the connecting plug is a is electrically and physically compatible with the trailer port;
wherein the connecting plug further comprises an electrical ground pin, a brake signal pin, a tail and running light signal pin, a battery connection pin, a left turn and left brake signal pin, a right turn and right brake signal pin, and a reverse light signal pin;
wherein the electrical ground pin is an electrical conductor that inserts into the trailer port;
wherein the brake signal pin is an electrical conductor that inserts into the trailer port;
wherein the tail and running light signal pin is an electrical conductor that inserts into the trailer port;
wherein the battery connection pin is an electrical conductor that inserts into the trailer port;
wherein the left turn and left brake signal pin is an electrical conductor that inserts into the trailer port;
wherein the right turn and right brake signal pin is an electrical conductor that inserts into trailer port;
wherein the reverse light signal pin is an electrical conductor that inserts into the trailer port.

5. The testing device according to claim 4
wherein the timing circuit is an electrical circuit;
wherein the timing circuit is triggered by the application of power to the trigger lead of the timing circuit;
wherein the timing circuit generates a regular output signal that times the flashing of the plurality of operating lights in an emergency situation;
wherein the power lead is the lead of the timing circuit that draws electrical energy from the battery;
wherein the ground lead is the lead of the timing circuit that completes the power circuit between the timing circuit and the battery;
wherein the trigger lead is an input of the timing circuit;
wherein the trigger lead initiates the cycling of the output signal of the timing circuit.

6. The testing device according to claim 5
wherein the transistor operates as a switch;
wherein the relay is an electrically operated switch;
wherein the relay controls the flow of electricity into the connecting plug when the testing device is in a flashing mode;
wherein the relay further comprises a relay coil and a relay switch;
wherein the relay coil is further defined with a seventh lead and an eighth lead;
wherein the relay switch is further defined with a ninth lead and a tenth lead.

7. The testing device according to claim 6
wherein the relay coil is energized by the transistor;
wherein when the relay coil is energized the relay coil closes the relay switch thereby allowing current to flow from the battery into the connecting plug;
wherein when the relay coil is de-energized the relay coil opens the relay switch thereby discontinuing current flow from the battery into the connecting plug;
wherein the relay switch is a normally open switch;
wherein the relay switch controls the flow of electricity from the battery to the connecting plug in the flashing mode.

8. The testing device according to claim 7
wherein the transistor energizes the relay coil when the output signal of the timing circuit is active;
wherein the transistor de-energizes the relay coil when the output signal of the timing circuit is inactive;
wherein the pull-up resistor is a resistor that limits the flow of electricity from the battery into the transistor.

9. The testing device according to claim 8
wherein the battery is a commercially available rechargeable battery;
wherein the charging plug is an electrical circuit that reverses the polarity of the rechargeable battery;
wherein the charging plug attaches to a vehicle electric power system using a charging port.

10. The testing device according to claim 9
wherein the diode is an electrical device that allows current to flow in only one direction;
wherein the diode installs between the rechargeable battery and the charging plug such that electricity will not flow from the first positive terminal of the rechargeable battery into the second positive terminal of the vehicle electric power system.

11. The testing device according to claim 10
wherein the housing is a hollow rectangular block structure;
wherein the housing further comprises a protecting cap and a hinge;
wherein the protecting cap encloses the connecting plug of the testing circuit;
wherein the hinge attaches the protecting cap to the body of the housing such that the protecting cap rotates over and away from the connecting plug.

12. The testing device according to claim 11 wherein the charging plug is a cigarette lighter adapter.

13. The testing device according to claim 12
wherein the second positive terminal of the vehicle electric power system electrically connects to the thirteenth lead of the charging port;
wherein the thirteenth lead of the charging port electrically connects to the eleventh lead of the charging plug when the charging plug inserts into the charging port;
wherein the second negative terminal of the vehicle electric power system electrically connects to the fourteenth lead of the charging port;
wherein the fourteenth lead of the charging port electrically connects to the twelfth lead of the charging plug when the charging plug inserts into the charging port;
wherein the eleventh lead of the charging plug electrically connects to the anode of the diode;
wherein the cathode of the diode electrically connects to the first positive terminal of the battery;
wherein the first positive terminal of the battery electrically connects to the first lead of the switch.

14. The testing device according to claim 13
wherein the second lead of the switch electrically connects to the brake signal pin of the connecting plug;
wherein the second lead of the switch electrically connects to the tail and running light signal pin of the connecting plug;
wherein the second lead of the switch electrically connects to the battery connection pin of the connecting plug;
wherein the second lead of the switch electrically connects to the left turn and left brake signal pin of the connecting plug;
wherein the second lead of the switch electrically connects to the right turn and right brake signal pin of the connecting plug;
wherein the second lead of the switch electrically connects to the reverse light signal pin of the connecting plug;
wherein the third lead of the switch is electrically isolated;
wherein the fourth lead of the switch electrically connects to the power lead of the timing circuit;
wherein the fourth lead of the switch electrically connects to the trigger lead of the timing circuit;
wherein the fourth lead of the switch electrically connects to the fifth lead of the pull-up resistor;
wherein the fourth lead of the switch electrically connects to the ninth lead of the relay switch of the relay.

15. The testing device according to claim 14
wherein the output signal of the timing circuit electrically connects to the base of the transistor;
wherein the sixth lead of the pull-up resistor electrically connects to the collector of the transistor;
wherein the emitter of the transistor electrically connects to the seventh lead of the relay coil of the relay;
wherein the tenth lead of the relay switch electrically connects to the brake signal pin of the connecting plug;
wherein the tenth lead of the relay switch electrically connects to the tail and running light signal pin of the connecting plug;
wherein the tenth lead of the relay switch electrically connects to the battery connection pin of the connecting plug;
wherein the tenth lead of the relay switch electrically connects to the left turn and left brake signal pin of the connecting plug;
wherein the tenth lead of the relay switch electrically connects to the right turn and right brake signal pin of the connecting plug;
wherein the tenth lead of the relay switch electrically connects to the reverse light signal pin of the connecting plug.

16. The testing device according to claim 15
wherein the connecting plug inserts into the trailer port to form the following connections:
a) the electrical ground pin of the connecting plug electrically connects to the electrical ground socket of the trailer port;
b) the brake signal pin of the connecting plug electrically connects to the brake signal socket of the trailer port;
c) the tail and running light signal pin of the connecting plug electrically connects to the tail and running light signal socket of the trailer port;
d) the battery connection pin of the connecting plug electrically connects to the battery connection socket of the trailer port;
e) the left turn and left brake signal pin of the connecting plug electrically connects to the left turn and left brake signal socket of the trailer port;
f) the right turn and right brake signal pin of the connecting plug electrically connects to the right turn and right brake signal socket of the trailer port; and,
g) the reverse light signal pin of the connecting plug electrically connects to the reverse light signal socket of the trailer port.

17. The testing device according to claim 16
wherein the ground lead of the timing circuit electrically connects to the first negative terminal of the battery;
wherein the twelfth lead of the charging plug electrically connects to the first negative terminal of the battery;
wherein the electrical ground pin of the connecting plug electrically connects to the first negative terminal of the battery;
wherein the eighth lead of the relay coil electrically connects to the first negative terminal of the battery.

* * * * *